(12) United States Patent
Shimada et al.

(10) Patent No.: US 7,203,474 B2
(45) Date of Patent: Apr. 10, 2007

(54) RECEIVER SYSTEM

(75) Inventors: Yoshikazu Shimada, Kyoto (JP);
Hiroyuki Ashida, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 551 days.

(21) Appl. No.: 10/277,870

(22) Filed: Oct. 23, 2002

(65) Prior Publication Data

US 2003/0078028 A1 Apr. 24, 2003

(30) Foreign Application Priority Data

Oct. 24, 2001 (JP) ............................. 2001-326383
Oct. 24, 2001 (JP) ............................. 2001-326431
Dec. 6, 2001 (JP) ............................. 2001-372110

(51) Int. Cl.
*H04B 1/10* (2006.01)
*H03H 7/00* (2006.01)

(52) U.S. Cl. ...................... 455/307; 455/334; 333/167

(58) Field of Classification Search ............... 455/307, 455/334, 339, 63.1, 67.13; 333/167, 184, 333/185, 213, 214, 216, 217; 330/235, 257, 330/277, 288
See application file for complete search history.

(56) References Cited

U.S. PATENT DOCUMENTS 3,824,496 A * 7/1974 Hekimian .................. 330/107
5,539,241 A * 7/1996 Abidi et al. ................ 257/531
6,175,727 B1 * 1/2001 Mostov ...................... 455/307
6,809,616 B2 * 10/2004 Liu et al. .................... 333/214

FOREIGN PATENT DOCUMENTS

| JP | 62-287720 | 12/1987 |
| JP | 2-13304 | 1/1990 |
| JP | 05-090992 | 4/1993 |
| JP | 11-186873 | 7/1999 |

* cited by examiner

*Primary Examiner*—Quochien B. Vuong
(74) *Attorney, Agent, or Firm*—Morgan, Lewis & Bockius, LLP

(57) ABSTRACT

A conventional receiver system has a filter circuit with unsatisfactory gain characteristics, and thus does not offer satisfactory reception performance. A receiver system of the invention has a filter circuit employing an equivalent inductor circuit including a capacitor, a gyrator composed of a plurality of operational transconductance amplifiers and having the capacitor as a load, and a resistor connected in series with the capacitor. A conventional receiver system has a band-pass filter circuit with a low third-order input intercept point, and thus does not offer satisfactory reception performance. The receiver system of the invention has, in the stage following a mixer, a band-pass filter circuit composed of a low-pass filter and a band-pass filter receiving the output signal of the low-pass filter, wherein the value obtained by dividing the higher cutoff frequency of the band-pass filter by the lower cutoff frequency thereof is smaller than 2, the center frequency of the band-pass filter is within a range of from about 1 to 3 MHz, and the cutoff frequency of the low-pass filter is higher than the center frequency of the band-pass filter.

10 Claims, 13 Drawing Sheets

RECEIVER SYSTEM

BACKGROUND OF THE INVENTION

1. Field of the Invention

The present invention relates to a receiver system. More particularly, the present invention relates to a receiver system provided with a filter circuit employing an operational transconductance amplifier.

2. Description of the Prior Art

A receiver system is usually provided with a filter circuit in the form of an integrated circuit. When a filter circuit including an inductor is formed into an integrated circuit, since the inductor is difficult to integrate, it is customary to use, instead of an inductor having one end grounded as shown in FIG. 13A, an equivalent inductor circuit L1 as shown in FIG. 13B and, instead of a floating inductor as shown in FIG. 14A, an equivalent inductor circuit L2 as shown in FIG. 14B.

The equivalent inductor circuit L1 of FIG. 13B is composed of operational transconductance amplifiers (hereinafter referred to as OTAs) 1 and 2 and a capacitor C1. The output terminal of the OTA 1 and the non-inverting input terminal of the OTA 2 are connected together, and the node between these serves as an end of the equivalent inductor circuit L1. The inverting input terminal of the OTA 1 and the output terminal of the OTA 2 are connected together, and the node between these is connected to one end of the capacitor C1. The other end of the capacitor C1, the non-inverting input terminal of the OTA 1, and the inverting input terminal of the OTA 2 are grounded. The equivalent inductance $L_1$ of the equivalent inductor circuit L1 is given by formula (1) below, where $C_1$ represents the reactance of the capacitor C1, and gm represents the conductance of each of the OTAs 1 and 2.

$$L_1 = C_1/(gm)^2 \qquad (1)$$

On the other hand, the equivalent inductor circuit L2 of FIG. 14B is composed of OTAs 3, 4, and 5, and a capacitor C2. The output terminal of the OTA 3 and the non-inverting input terminal of the OTA 4 are connected together, and the node between these serves as one end of the equivalent inductor circuit L2. The inverting input terminal of the OTA 4 and the output terminal of the OTA 5 are connected together, and the node between these serves as the other end of the equivalent inductor circuit L2. The inverting input terminal of the OTA 3, the output terminal of the OTA 4, and the non-inverting input terminal of the OTA 5 are connected together, and the node among these is connected to one end of the capacitor C2. The other end of the capacitor C2, the non-inverting input terminal of the OTA 3, and the inverting input terminal of the OTA 5 are grounded. The equivalent inductance $L_2$ of the equivalent inductor circuit L2 is given by formula (2) below, where $C_2$ represents the reactance of the capacitor C2, and gm represents the conductance of each of the OTAs 3, 4, and 5.

$$L_2 = C_2/(gm)^2 \qquad (2)$$

Ideally, an equivalent inductor circuit is equivalent to an inductor having no resistance; in reality, however, it includes resistance. As an example, a Smith chart in FIG. 15 shows the impedance characteristics of the equivalent inductor circuit L1 where $C_1$=3.7 [pF] and gm=165 [µS].

The imaginary part of the impedance of the equivalent inductor circuit L1 becomes greater as the frequency of the input signal becomes higher. Since the imaginary part of the impedance of the equivalent inductor circuit L1 remains positive irrespective of the frequency of the input signal, the equivalent inductor circuit L1 functions as an inductor.

On the other hand, the real part of the impedance of the equivalent inductor circuit L1 becomes smaller as the frequency of the input signal becomes higher, and eventually becomes negative when the frequency of the input signal becomes higher than 900 kHz. That is, the impedance of the equivalent inductor circuit L1 comes to include negative resistance when the frequency of the input signal becomes higher than 900 kHz.

The presence of such negative resistance leads to oscillation. The impedance characteristics of the equivalent inductor circuit L2 are similar to those of the equivalent inductor circuit L1.

When a filter circuit is formed into an integrated circuit, a resistor having one end grounded as shown in FIG. 16A is often replaced with an equivalent resistor circuit R1 as shown in FIG. 16B. The equivalent resistor circuit R1 of FIG. 16B is composed of an OTA 6. The output terminal and the inverting input terminal of the OTA 6 are connected together, and the node between these serves as an end of the equivalent resistor circuit R1. The non-inverting input terminal of the OTA 6 is grounded. The equivalent resistance $R_1$ of the equivalent resistor circuit R1 is given by formula (3) below, where gm represents the conductance of the OTA 6.

$$R_1 = 1/gm \qquad (3)$$

FIG. 17 shows the configuration of a band-pass filter circuit, as an example of a conventional filter circuit employing the equivalent inductor and resistor circuits described above.

An input terminal 7 is connected to one end of an equivalent inductor circuit L3. The other end of the equivalent inductor circuit L3 is connected to one end of a capacitor C3. The other end of the capacitor C3 is connected to one end of a capacitor C4, to an equivalent inductor circuit L4, and to one end of an equivalent inductor circuit L5. The other end of the capacitor C4 is grounded, and the other end of the equivalent inductor circuit L5 is connected to one end of a capacitor C5.

The other end of the capacitor C5 is connected to one end of a capacitor C6, to an equivalent inductor circuit L6, to an equivalent resistor circuit R2, and to an output terminal 8. The other end of the capacitor C6 is grounded.

Here, the equivalent inductor circuits L3 and L5 have the same configuration as the equivalent inductor circuit L2 shown in FIG. 14B, and the equivalent inductor circuits L4 and L6 have the same configuration as the equivalent inductor circuit L1 shown in FIG. 13B. The equivalent resistor circuit R2 has the same configuration as the equivalent resistor circuit R1 shown in FIG. 16B.

When the circuit constants of the band-pass filter circuit of FIG. 17 are so set that $f_C$=2 MHz, the gain characteristics obtained exhibit, as shown in FIG. 18, undesirable peaks near the lower cutoff frequency $f_{C1}$ and the upper cutoff frequency $f_{C2}$. This results from the above-described impedance characteristics of the equivalent inductor circuits, specifically, the presence of negative resistance in the impedance of the equivalent inductor circuits L3 to L6 in the frequency band above 900 kHz. A receiver system, when provided with a band-pass filter circuit with such inadequate gain characteristics, does not offer satisfactory reception performance.

Moreover, in the band-pass filter circuit of FIG. 17, the constants of the individual circuit elements are determined arbitrarily, and the different circuit elements have different individual variations originating from their fabrication. This makes it impossible to reduce variations in the cutoff frequencies, which are determined by those circuit constants. To obtain the cutoff frequencies as designed, a band-pass filter circuit is sometimes so configured as to be adjustment-free by being provided with a phase control loop. However, even in this configuration, the equivalent inductor circuits provided in the filter circuit (for example, a low-pass filter circuit) provided in the phase control loop and those provided in the band-pass filter circuit have negative resistance. Thus, the individual filter circuits have unsatisfactory gain characteristics, and produce great errors in the actually obtained cutoff frequencies from their design values.

Incidentally, one type of receiver system is superheterodyne receiver apparatuses. In a superheterodyne receiver apparatus, a band-pass filter is provided in the stage following a mixer that down-converts a received RF (radio-frequency) signal and outputs an IF (intermediate-frequency) signal. The bandpass filter serves to eliminate unnecessary frequency components from the IF signal.

In superheterodyne receiver apparatuses that handle IF signals in a frequency band of from about 1 to 3 MHz, a band-pass filter for eliminating unnecessary frequency components from the IF signal is generally built as a bandpass filter circuit (hereinafter referred to also as a gm band-pass filter) employing operational transconductance amplifiers as shown in FIG. 17 and described above. This permits the integration of the band-pass filter for eliminating unnecessary frequency components from the IF signal.

On the other hand, in superheterodyne receiver apparatuses that handle IF signals in a frequency band of from about 100 to 200 MHz, it is necessary to use a band-pass filter of a high order to eliminate unnecessary frequency components from the IF signal. Accordingly, here, the band-pass filter for eliminating unnecessary frequency components from the IF signal is generally built not as a gm band-pass filter but as a SAW (surface-acoustic-wave) filter or the like.

The gm band-pass filter of FIG. 17 has the inductors L3 to L6 built as equivalent inductor circuits employing operational transconductance amplifiers, and thus can be integrated. However, the gm band-pass filter of FIG. 17 includes active elements (transistors) inside the operational transconductance amplifiers, and thus suffers from distortion in the input-output characteristics. This distortion causes intermodulation.

One commonly used indicator of the degree of distortion is the third-order input intercept point. Now, with reference to FIG. 19, which shows the distortion characteristics of the gm band-pass filter of FIG. 17, the third-order input intercept point will be explained. The third-order intercept point IIP3' is the intersection point between the extension line of the linear portion of the curve representing the output 107 of the target signal (the signal at the center frequency of the gm band-pass filter of FIG. 17) with respect to the input signal and the extension line of the linear portion of the curve representing the output 108 of the third-order intermodulation distortion with respect to the input signal. The third-order input intercept point IIP3' represents the level of the input signal at the third-order intercept point IP3'.

Here, the output 108 of the third-order intermodulation distortion is determined by feeding two signals, having frequencies of 5 MHz and 8 MHz respectively and having identical levels, to the gm band-pass filter of FIG. 17 and measuring the levels of the third-order intermodulation distortion appearing in the output signal, i.e., the levels of a 2 (2×5−8) MHz signal and a 11 (2×8−5) MHz (this method is called two-tone measurement).

The higher the third-order input intercept point IIP3', the less the gm band-pass filter of FIG. 17 is affected by interfering waves. With the gm band-pass filter of FIG. 17, however, the third-order input intercept point IIP3' is too low, specifically, −2 dBm. Moreover, here, the third-order input intercept point IIP3' is not expected to be improved by the adjustment of the circuit constants. A receiver system, when provided with a gm band-pass filter with too low a value of the third-order input intercept point IIP3', does not offer satisfactory reception performance.

SUMMARY OF THE INVENTION

An object of the present invention is to provide a receiver system that offers excellent reception performance.

To achieve the above object, according to one aspect of the present invention, an equivalent inductor circuit is provided with: a capacitor; a gyrator composed of a plurality of operational transconductance amplifiers and having the capacitor as a load; and a resistor connected in series with the capacitor. A receiver system is provided with a filter circuit employing an equivalent inductor circuit as described above.

According to another aspect of the present invention, a receiver system is provided with: an antenna for receiving a high-frequency signal; an amplifier for amplifying the high-frequency signal output from the antenna; a local oscillator for producing a local oscillation signal; a mixer for mixing the output signal of the amplifier and the local oscillation signal to produce an intermediate signal; and a band-pass filter circuit for eliminating unnecessary frequency components from the output signal of the mixer. The band-pass filter circuit is composed of a low-pass filter that receives the output signal of the mixer and a band-pass filter that receives the output signal of the low-pass filter. Here, the value obtained by dividing the higher cutoff frequency of the band-pass filter by the lower cutoff frequency thereof is smaller than 2, the center frequency of the band-pass filter is within a range of from about 1 to 3 MHz, and the cutoff frequency of the low-pass filter is higher than the center frequency of the band-pass filter.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Hereinafter, embodiments of the present invention will be described with reference to the drawings. First, the equivalent inductor circuits employed in a filter circuit embodying the invention will be described with reference to FIGS. 7 and 8.

Figure 7:
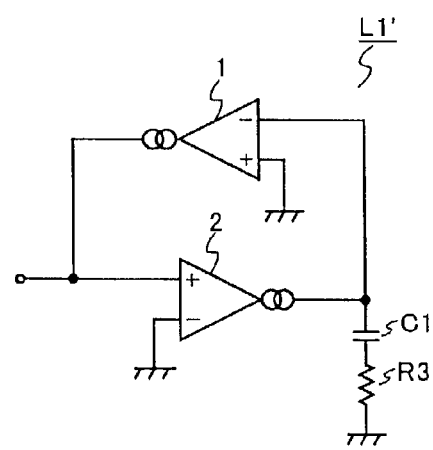
FIG. 7 is a diagram showing one configuration of the equivalent inductor circuits provided in the band-pass filter circuit of FIG. 1.
Figure 13A:
FIG. 13A is a diagram showing an inductor having one end grounded.
Figure 13B:
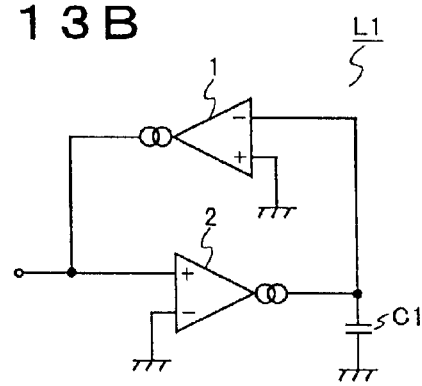
FIG. 13B is a conventional equivalent inductor circuit equivalent to the inductor having one end grounded shown in FIG. 13A.

FIG. 7 shows the configuration of an equivalent inductor circuit L1' equivalent to an inductor having one end grounded (see FIG. 13A). It is to be noted that such circuit elements as are found also in FIG. 13B are identified with the same reference numerals and symbols, and their explanations will be omitted. The equivalent inductor circuit L1' differs from the equivalent inductor circuit L1 in that the former is additionally provided with a resistor R3 connected in series with the capacitor C1. That is, the end of the capacitor C1 that is not connected to the OTA is grounded through the resistor R3.

Here, direct-current voltage sources may be provided individually between the non-inverting input terminal of the OTA 1 and ground and between the inverting input terminal of the OTA 2 and ground so that predetermined biases are applied to the non-inverting input terminal of the OTA 1 and the inverting input terminal of the OTA 2.

Figure 8:
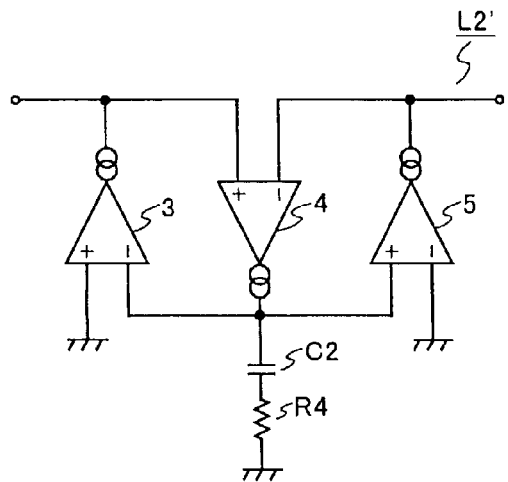
FIG. 8 is a diagram showing another configuration of the equivalent inductor circuits provided in the band-pass filter circuit of FIG. 1.
Figure 14A:
FIG. 14A is a diagram showing a floating inductor.
Figure 14B:
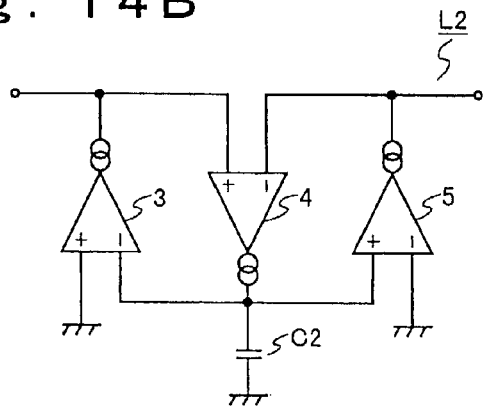
FIG. 14B is a conventional equivalent inductor circuit equivalent to the floating inductor shown in FIG. 14A.
Figure 15:
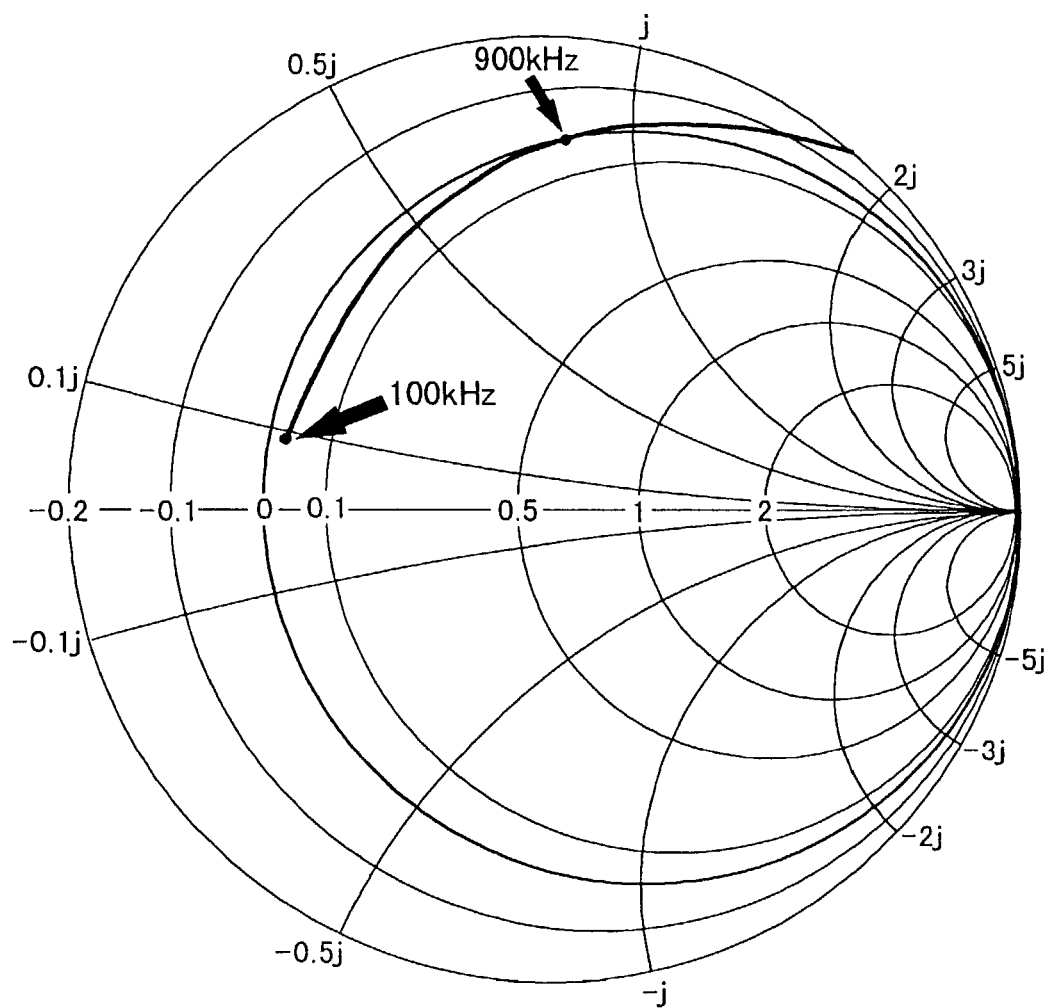
FIG. 15 is a Smith chart showing the impedance characteristics of the equivalent inductor circuit of FIG. 13B.
Figure 16A:
FIG. 16A is a diagram showing a resistor having one end grounded.
Figure 16B:
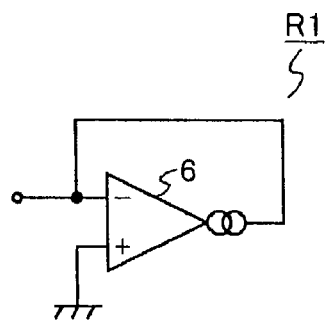
FIG. 16B is a conventional equivalent resistor circuit equivalent to the resistor having one end grounded shown in FIG. 16A.

FIG. 8 shows the configuration of an equivalent inductor circuit L2' equivalent to a floating inductor (see FIG. 14A). It is to be noted that such circuit elements as are found also in FIG. 14B are identified with the same reference numerals and symbols, and their explanations will be omitted. The equivalent inductor circuit L2' differs from the equivalent inductor circuit L2 in that the former is additionally provided with a resistor R4 connected in series with the capacitor C2. That is, the end of the capacitor C2 that is not connected to the OTA is grounded through the resistor R4.

Here, direct-current voltage sources may be provided individually between the non-inverting input terminal of the OTA 3 and ground and between the inverting input terminal of the OTA 5 and ground so that predetermined biases are applied to the non-inverting input terminal of the OTA 3 and the inverting input terminal of the OTA 5.

Figure 9:
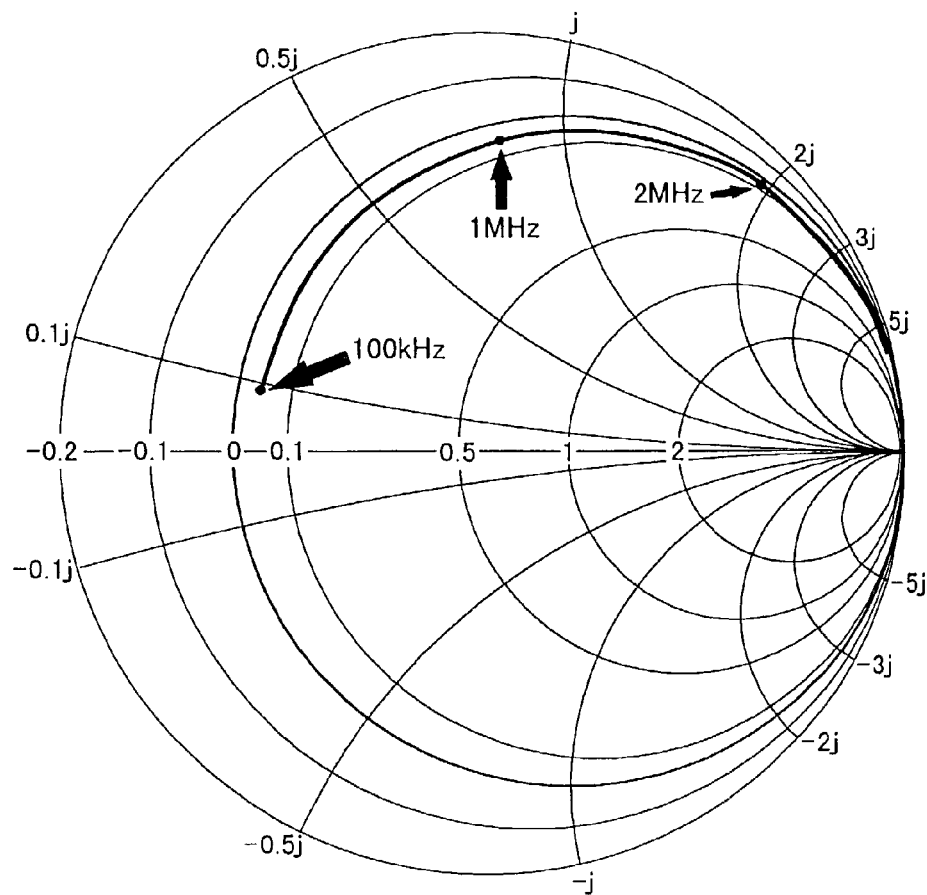
FIG. 9 is a Smith chart showing the impedance characteristics of the equivalent inductor circuit of FIG. 7.

Next, the impedance characteristics of the equivalent inductor circuits employed in a filter circuit embodying the invention will be described. As an example, a Smith chart in FIG. 9 shows the impedance characteristics of the equivalent inductor circuit L1' where $C_1=3.7$ [pF], gm=165 [$\mu$S], and the resistance of the resistor R3 $R_3=2.6$ [k$\Omega$].

The imaginary part of the impedance of the equivalent inductor circuit L1' becomes greater as the frequency of the input signal becomes higher. Since the imaginary part of the impedance of the equivalent inductor circuit L1' remains positive irrespective of the frequency of the input signal, the equivalent inductor circuit L1' functions as an inductor.

On the other hand, the real part of the impedance of the equivalent inductor circuit L1' becomes smaller as the frequency of the input signal becomes higher. However, here, as opposed to a conventional equivalent inductor circuit, the real part of the impedance of the equivalent inductor circuit L1' never becomes negative. That is, the impedance of the equivalent inductor circuit L1' never comes to include negative resistance. The impedance characteristics of the equivalent inductor circuit L2' are similar to those of the equivalent inductor circuit L1'.

In this way, in these equivalent inductor circuits, the provision of the resistor connected in series with the capacitor makes it possible to prevent oscillation even when the frequency of the input signal is high.

In the equivalent inductor circuits of this embodiment, the resister connected in series with the capacitor is connected to the end of the capacitor that is not connected to the OTA. However, the resistor connected in series with the capacitor may be connected to the end of the capacitor that is connected to the OTA to achieve the same effects. In that case, the capacitor is connected to the OTA not directly but through the resistor. For the purpose of preventing oscillation when the frequency of the input signal is high, it is advisable to give the resistor connected in series with the capacitor a resistance in a range of from a few hundred $\Omega$ to a few k$\Omega$. The lower the conductance of the OTA, the lower the resistance of the resistor connected in series with the capacitor may be.

Figure 17:
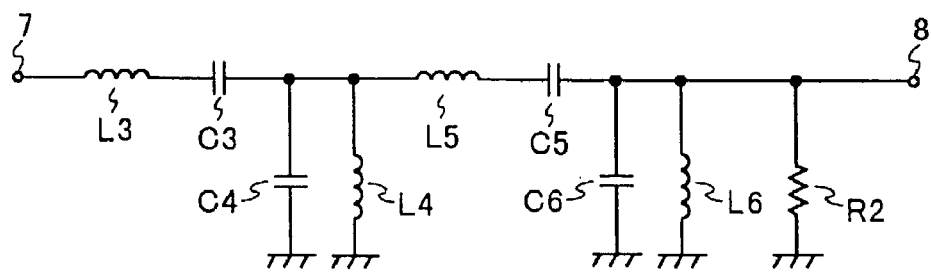
FIG. 17 is a diagram showing the configuration of a conventional band-pass filter.

Next, as an example of a filter circuit embodying the invention, a bandpass filter circuit will be described with reference to FIG. 1. It is to be noted that such circuit elements as are found also in FIG. 17 are identified with the same reference numerals and symbols, and their explanations will be omitted.

An input terminal 7 is connected to one end of an equivalent inductor circuit L3'. The other end of the equivalent inductor circuit L3' is connected to one end of a capacitor C3. The other end of the capacitor C3 is connected to one end of a capacitor C4, to an equivalent inductor circuit L4', and to one end of an equivalent inductor circuit L5'. The other end of the capacitor C4 is grounded, and the other end of the equivalent inductor circuit L5' is connected to one end of a capacitor C5.

The other end of the capacitor C5 is connected to one end of a capacitor C6, to an equivalent inductor circuit L6', to an equivalent resistor circuit R2, and to an output terminal 8. The other end of the capacitor C6 is grounded.

Here, the equivalent inductor circuits L3' and L5' have the same configuration as the equivalent inductor circuit L2' shown in FIG. 8, and the equivalent inductor circuits L4' and L6' have the same configuration as the equivalent inductor circuit L1' shown in FIG. 7.

Figure 1:
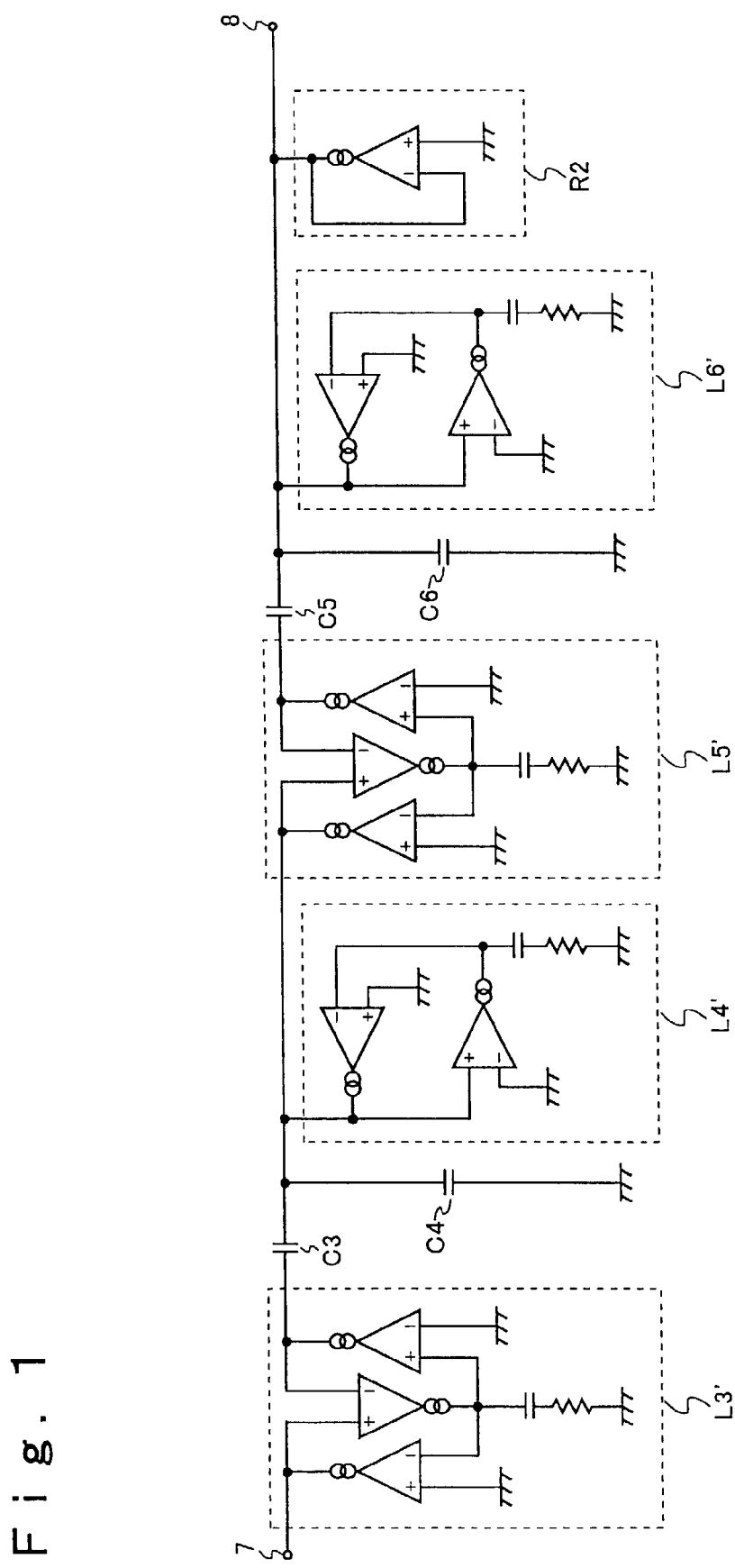
FIG. 1 is a diagram showing the configuration of a band-pass filter circuit embodying the invention.
Figure 2:
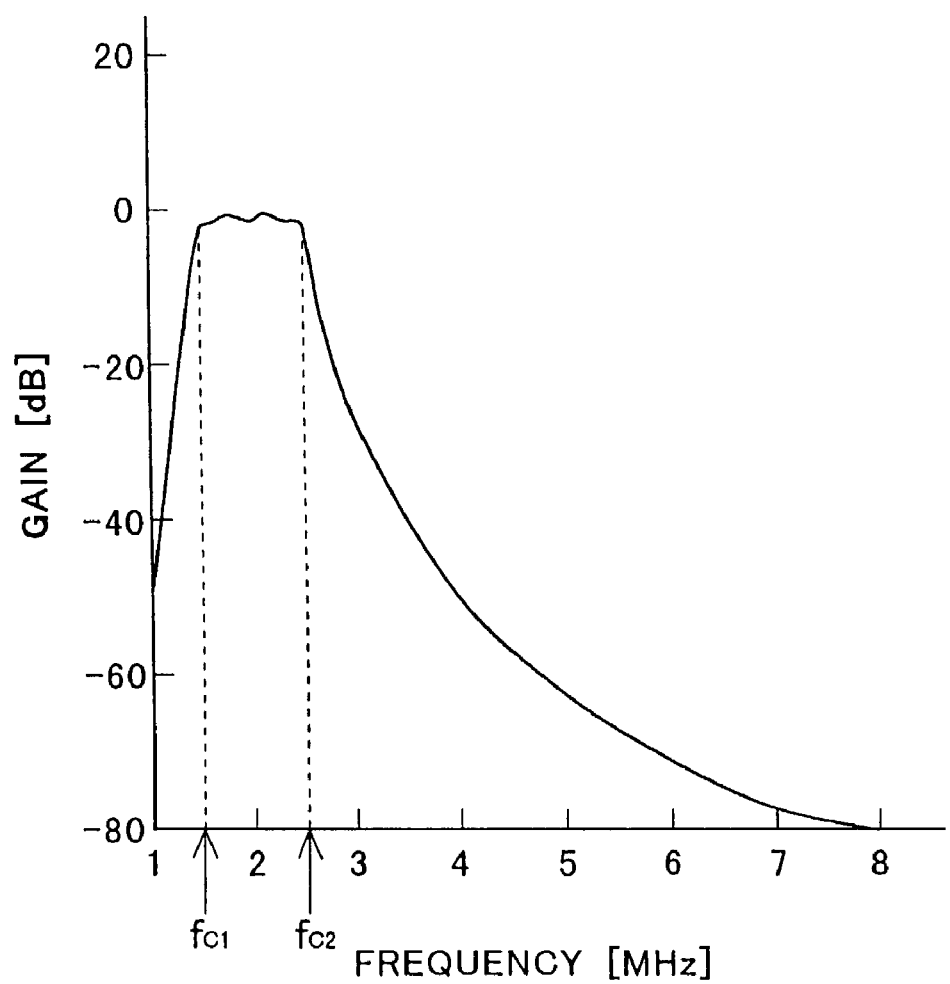
FIG. 2 is a graph showing the gain characteristics of the band-pass filter circuit of FIG. 1.

When the circuit constants are so set that $f_C=2$ MHz, the band-pass filter circuit of FIG. 1 exhibits gain characteristics as shown in FIG. 2. FIG. 2 clearly shows that there are no peaks near the lower cutoff frequency $f_{C1}$ and the upper cutoff frequency $f_{C2}$ as are observed in the gain characteristic curve of a conventional band-pass filter circuit. That is, satisfactory gain characteristics are obtained, with the gain kept at approximately 0 dB throughout the pass frequency band. This results from the impedance characteristics of the equivalent inductor circuits provided in the band-pass filter circuit of FIG. 1, specifically, as described earlier in connection with FIG. 9, the absence of negative resistance in the impedance of the equivalent inductor circuits L3' to L6' in the frequency band above 900 kHz.

Figure 3:
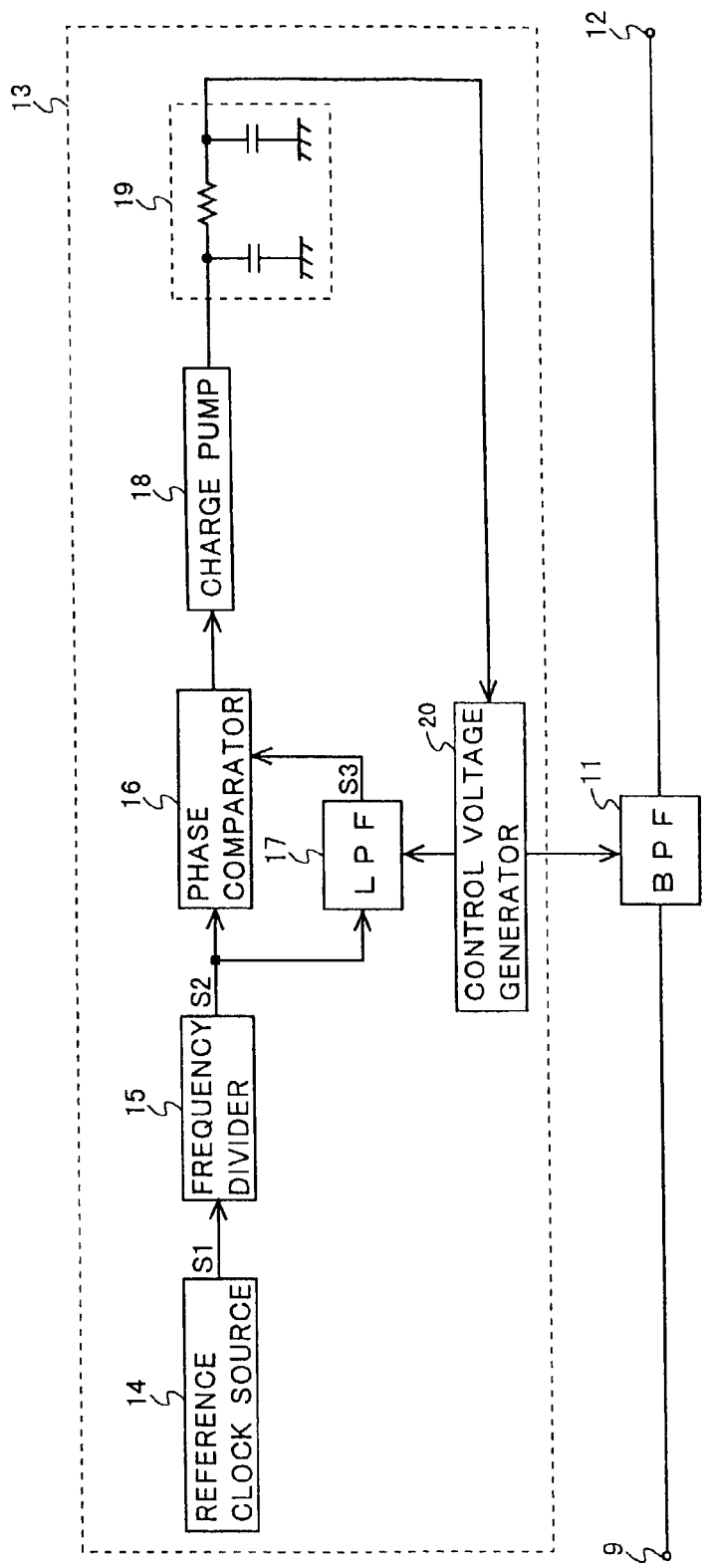
FIG. 3 is a circuit block diagram of an adjustment-free band-pass filter circuit embodying the invention.

Next, an adjustment-free band-pass filter circuit embodying the invention, wherein the band-pass filter circuit of FIG. 1 is employed, will be described. FIG. 3 shows a circuit block diagram of this adjustment-free band-pass filter circuit.

A band-pass filter circuit 11, by eliminating unnecessary frequency components from an input signal fed in by way of an input terminal 9, produces an output signal, which is then fed out by way of an output terminal 12.

Used as the band-pass filter circuit 11 here is the band-pass filter circuit of FIG. 1, with the center frequency of the pass band set at 2 MHz.

The center frequency of the band-pass filter circuit 11 is not always precisely equal to the design value because of variations originating from its fabrication. To cope with this, the adjustment-free band-pass filter circuit is provided with a phase control loop 13 for automatically calibrating the center frequency of the band-pass filter circuit 11 to be as designed. Now, the phase control loop 13 will be described.

A reference clock source 14 feeds a clock signal S1 having a predetermined frequency (for example, 13 MHz) to a frequency divider circuit 15. The frequency divider circuit 15 divides the frequency of the clock signal S1 by a factor of N to achieve 1/N frequency division (where N is a natural number, for example, 12), and feeds the divided signal S2 (for example, having a frequency of 1.0833 MHz) to a phase comparator circuit 16 and to a low-pass filter circuit 17.

The circuit constants of the low-pass filter circuit 17 are so set that its cutoff frequency $f_C$ is equal to the frequency of the divided signal S2. The low-pass filter circuit 17 feeds the phase comparator circuit 16 with a signal S3 that is 90° delayed relative to the divided signal S2.

The phase comparator circuit 16 compares the phases of the divided signal S2 and the signal S3. When the delay in phase of the signal S3 relative to the divided signal S2 is equal to 90°, the phase comparator circuit 16 outputs no signal. When the delay in phase of the signal S3 relative to the divided signal S2 is more than 90°, the phase comparator circuit 16 outputs a positive pulse voltage signal. When the delay in phase of the signal S3 relative to the divided signal S2 is less than 90°, the phase comparator circuit 16 outputs a negative pulse voltage signal.

A charge pump circuit 18 converts the pulse voltage signal fed from the phase comparator circuit 16 into a current signal, and feeds the current signal to a loop filter 19. The loop filter 19 converts the current signal fed from the charge pump circuit 18 into a DC (direct-current) voltage signal, and feeds the DC voltage signal to a control voltage generator circuit 20.

The control voltage generator circuit 20 produces a control voltage $V_{BIAS}$ according to the DC voltage signal fed from the loop filter 19, and, by using the control voltage $V_{BIAS}$, controls the currents produced by the current sources provided inside the OTAs provided in the low-pass filter circuit 17 and the bandpass filter circuit 11.

By controlling the currents produced by the current sources provided inside the OTAs provided in the low-pass filter circuit 17 and the band-pass filter circuit 11, it is possible to control the conductances of the OTAs provided in the low-pass filter circuit 17 and the band-pass filter circuit 11, and thereby control the cutoff frequencies of the low-pass filter circuit 17 and the band-pass filter circuit 11. In this way, it is possible to make the cutoff frequency of the low-pass filter circuit 17 equal to the frequency of the divided signal S2. Here, if the low-pass filter circuit 17 and the band-pass filter circuit 11 have identical variations originating from their fabrication, the center frequency of the band-pass filter circuit 11 becomes equal to the design value (2 MHz).

Figure 4:
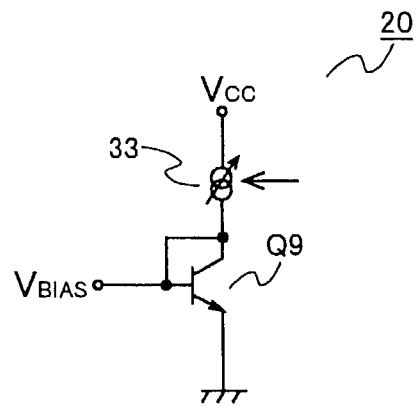
FIG. 4 is a diagram showing the configuration of the control voltage generator circuit provided in the adjustment-free band-pass filter circuit of FIG. 3.

FIG. 4 shows an example of the control voltage generator circuit 20. A terminal by way of which a constant voltage $V_{CC}$ is fed in is connected through a variable current source 33 to the collector of an NPN-type transistor Q9. The emitter of the transistor Q9 is grounded, and the collector and base of the transistor Q9 are connected together. As the DC voltage signal fed from the loop filter 19 varies, the output current of the variable current source 33 varies, and accordingly the control voltage $V_{BIAS}$, which is the base voltage of the transistor Q9, varies. The base of the transistor Q9 is connected to the bases of NPN-type transistors Q7 and Q8 (see FIG. 10) that constitute the current source of an OTA so as to form a current mirror circuit. Thus, the control voltage $V_{BIAS}$ permits the same current as the output current of the variable current source 33 to flow through the transistors Q7 and Q8.

Figure 5:
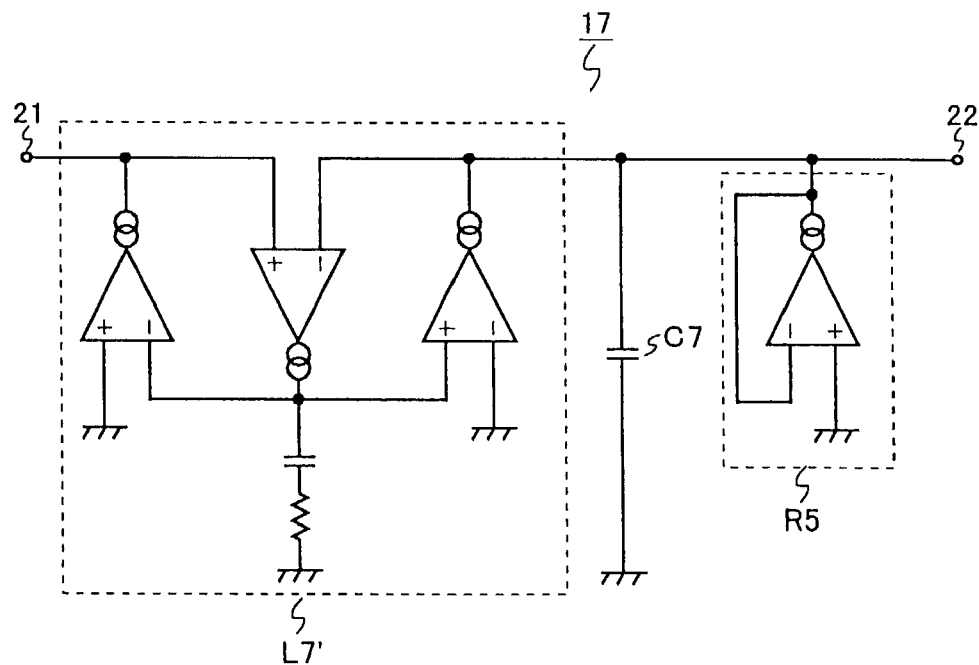
FIG. 5 is a diagram showing the configuration of the low-pass filter provided in the adjustment-free band-pass filter circuit of FIG. 3.

As described earlier, used as the band-pass filter circuit 11 is the bandpass filter circuit of FIG. 1. On the other hand, used as the low-pass filter circuit 17 is a low-pass filter circuit as shown in FIG. 5.

Now, the configuration of the low-pass filter circuit of FIG. 5 will be described. An input terminal 21 is connected to one end of an equivalent inductor circuit L7'. The other end of the equivalent inductor circuit L7' is connected to one end of a capacitor C7, to an equivalent resistor circuit R5, and to an output terminal 22. The other end of the capacitor C7 is grounded. Here, the equivalent inductor circuit L7' has the same configuration as the equivalent inductor circuit L2' shown in FIG. 8.

Thus, the band-pass filter circuit 11 and the low-pass filter circuit 17 both include a resistor (R4) for damping the Q factor, and therefore have satisfactory gain characteristics. This makes it possible to reduce the error of the center frequency of the band-pass filter circuit 11 from the design value (2 MHz).

Incidentally, in a filter circuit having in its input stage an equivalent resistor circuit equivalent to a floating resistor, the attenuation of the gain in the equivalent resistor circuit is minimized by maximizing the conductance of the OTA provided in the equivalent resistor circuit. On the other hand, in an equivalent inductor circuit, the higher the conductances of the OTAs provided in it, the more difficult it is to obtain a high inductance, and therefore the OTAs are given low conductances. That is, OTAs having different conductances are used in different parts of a filter circuit. As a result, the OTAs have different fabrication-associated variations in their conductances, leading to greater fabrication-associated errors in the filter's cutoff frequencies.

To avoid this, it is preferable that the band-pass filter circuit 11 be configured as a filter circuit having in its input stage an equivalent resistor circuit equivalent to a floating resistor of which the resistance can be regarded as zero, and that the OTAs provided in the band-pass filter circuit 11 and the low-pass filter circuit 17 all have identical conductances. By making the conductances of all the OTAs provided in the band-pass filter circuit 11 and the low-pass filter circuit 17 identical, it is possible to further reduce the error of the center frequency of the band-pass filter circuit 11 from the design value (2 MHz).

It is not only in the adjustment-free band-pass filter circuit of FIG. 3 but also in the band-pass filter circuit of FIG. 1 that making the conductances of all the OTAs identical helps reduce the error of the center frequency from the design value (2 MHz).

The band-pass filter circuit 11 and the low-pass filter circuit 17 use capacitors having different capacitances. This results in different fabrication-associated variations in those capacitances, and thus contributes to a great error in the center frequency of the band-pass filter circuit 11 from the design value (2 MHz).

To avoid this, it is preferable that each of the capacitors provided in the band-pass filter circuit 11 and the low-pass filter circuit 17 be formed as a circuit having a plurality of unit capacitors connected in series and/or in parallel. Here, the unit capacitor denotes a capacitor with a predetermined capacitance (for example, 1 [pF]).

It is advisable to optimize the capacitance of the unit capacitors and the combination of serial and parallel connection in such a way as to minimize the errors of their composite capacitances from the design capacitances, to minimize the areas they occupy, and to minimize the fabrication-associated variations in the capacitance of the unit capacitors. This makes it possible to further reduce the errors of the center frequency of the band-pass filter circuit 11 from the design value (2 MHz).

It is not only in the adjustment-free band-pass filter circuit of FIG. 3 but also in the band-pass filter circuit of FIG. 1 that forming each capacitor as a circuit having a plurality of unit capacitors connected in series and/or in parallel helps reduce the error of the center frequency from the design value (2 MHz).

Figure 10:
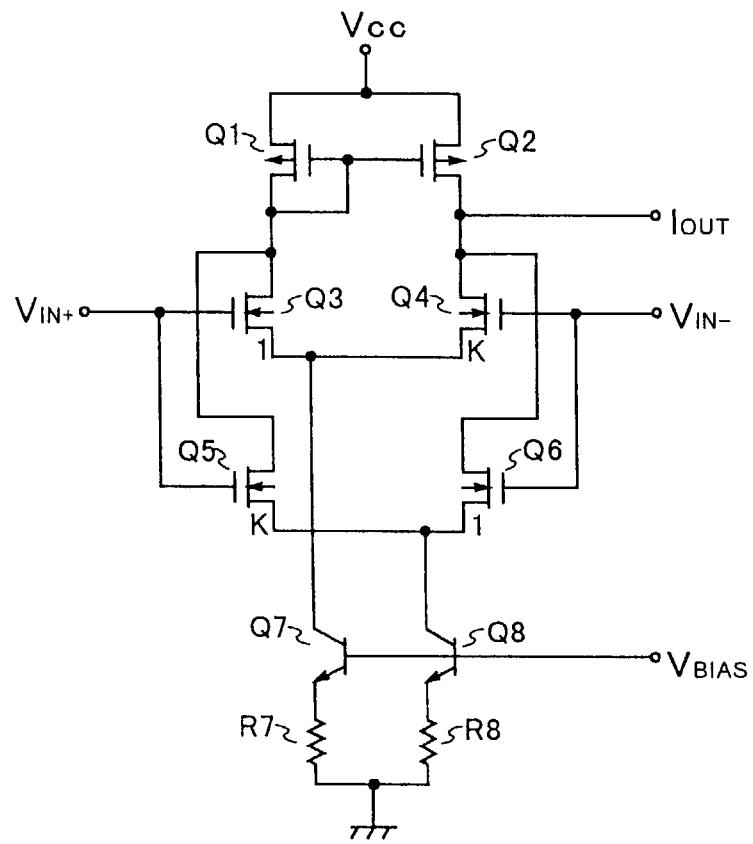
FIG. 10 is a diagram showing the configuration of the OTAs provided in the equivalent inductor circuits of FIGS. 7 and 8.

Next, an example of an OTA embodying the invention will be described with reference to FIG. 10. A terminal by way of which a constant voltage $V_{CC}$ is fed in is connected to the source of a PMOS transistor (MOSFET, metal-oxide semiconductor field-effect transistor) Q1 and to the source of a PMOS transistor Q2. The gates of the PMOS transistors Q1 and Q2 are connected together. The gate and drain of the PMOS transistor Q1 are connected together.

The drain of the PMOS transistor Q1 is connected to the drain of an NMOS transistor Q3 and to the drain of an NMOS transistor Q5. The drain of the PMOS transistor Q2 is connected to a terminal by way of which an output current $I_{OUT}$ is fed out, to the drain of an NMOS transistor Q4, and to the drain of an NMOS transistor Q6.

A terminal by way of which an input voltage $V_{IN+}$ is fed in is connected to the gate of the NMOS transistor Q3 and to the gate of the NMOS transistor Q5. A terminal by way of which an input voltage $V_{IN-}$ is fed in is connected to the gate of the NMOS transistor Q4 and to the gate of the NMOS transistor Q6.

The sources of the NMOS transistor Q3 and the NMOS transistor Q4 are connected together, and are connected to the collector of an NPN-type transistor Q7. The sources of the NMOS transistor Q5 and the NMOS transistor Q6 are connected together, and are connected to the collector of an NPN-type transistor Q8.

The emitter of the transistor Q7 is grounded through a resistor R7, and the emitter of the transistor Q8 is grounded through a resistor R8. Alternatively, the emitters of the transistors Q7 and Q8 may be grounded directly.

Here, the ratio of the value obtained by dividing the gate width of the NMOS transistor Q3 by its gate length to the value obtained by dividing the gate width of the NMOS transistor Q4 by its gate length is 1:K. Moreover, the ratio of the value obtained by dividing the gate width of the NMOS transistor Q5 by its gate length to the value obtained by dividing the gate width of the NMOS transistor Q6 by its gate length is K:1.

Now, the input-output characteristics of the OTA configured as described above will be described. The output current $I_{OUT}$ is given by formula (4), where $I_{D3}$, $I_{D4}$, $I_{D5}$, and $I_{D6}$ represent the drain currents of the NMOS transistors Q3, Q4, Q5, and Q6, respectively.

$$I_{OUT}=(I_{D3}+I_{D5})-(I_{D4}+I_{D6})$$

$$I_{OUT}=(I_{D3}-I_{D4})+(I_{D5}-I_{D6}) \quad (4)$$

Formula (4) shows that, when the NMOS transistors Q3 to Q6 are operating in the saturation region, and if the drain currents of the NMOS transistors Q3 to Q6 are linearly proportional to their gate-source voltages, setting K=1 results in making the conductance gm of the OTA constant irrespective of the input voltage ($V_{IN+}-V_{IN-}$).

In reality, however, when the NMOS transistors Q3 to Q6 are operating in the saturation region, the drain currents of the NMOS transistors Q3 to Q6 are proportional to their gate-source voltages not linearly but quadratically.

For this reason, the value of K needs to be so set that the output current $I_{OUT}$ is linearly proportional to the input voltage ($V_{IN+}-V_{IN-}$). Specifically, setting K=10 results in making the output current Iout linearly proportional to the input voltage ($V_{IN+}-V_{IN-}$) in a wide range of the input voltage ($V_{IN+}-V_{IN-}$) (for example, from 1 μV to 1 V peak to peak). That is, setting K=10 results in widening the dynamic range of the OTA.

The adjustment-free band-pass filter circuit described above is used, for example, in a superheterodyne receiver apparatus or the like. Now, the configuration of such a receiver apparatus will be described with reference to FIG. 6.

A high-frequency signal received by an antenna 23 is fed to a band-pass filter circuit 24, which eliminates unwanted frequency components from the high-frequency signal. The high-frequency signal cleared of unwanted frequency components is then fed to a low-noise amplifier 25 so as to be amplified, and is then fed to a mixer 26 so as to be mixed with a local oscillation signal fed from an oscillator 27 and thereby down-converted into an IF signal. The IF signal is passed through a band-pass filter circuit 28 so that unnecessary frequency components are eliminated from it, is then amplified by an amplifier 29, and is then fed to a demodulator circuit 30 so as to be demodulated into a received signal. The received signal, which is an analog signal, is converted into a digital signal by an AID (analog-to-digital) converter circuit 31, and the resulting digital signal is fed to an output terminal 32.

Here, used as the band-pass filter circuit 28 is the above-described adjustment-free band-pass filter circuit embodying the invention. This helps reduce the data error rate in the digital signal fed to the output terminal 32. That is, it is possible to obtain satisfactory reception performance.

Figure 6:
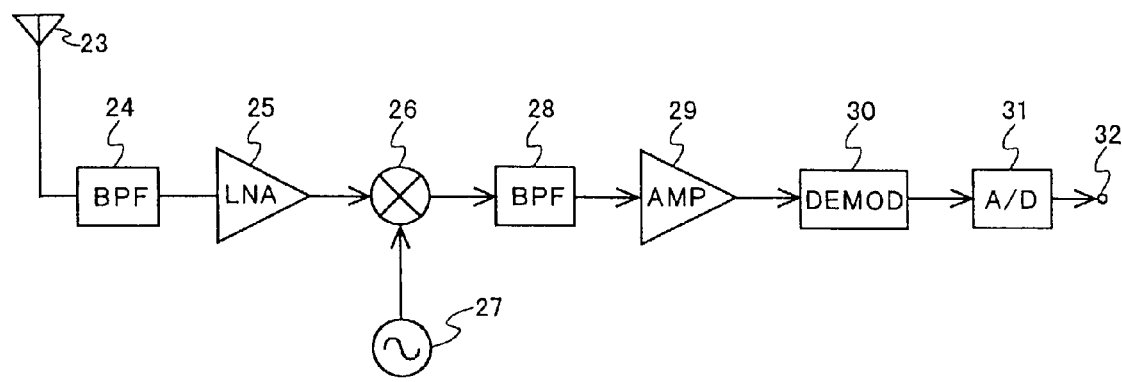
FIG. 6 is a circuit block diagram of a superheterodyne receiver apparatus.
Figure 11:
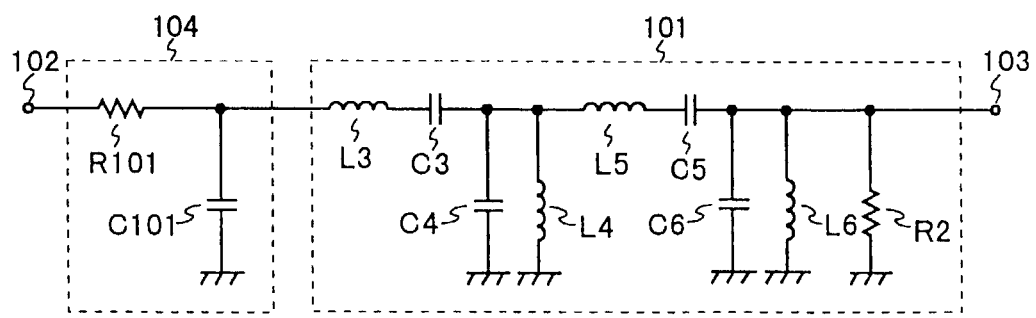
FIG. 11 is a diagram showing the configuration of the band-pass filter circuit provided in a receiver system embodying the invention.

Next, an embodiment will be described in which the receiver apparatus of FIG. 6 (for example, a portable telephone, personal computer, or audio-visual appliance exploiting Bluetooth) is provided with, as the band-pass filter circuit 28, a band-pass filter circuit as shown in FIG. 11. In this embodiment, the frequency of the IF signal of the receiver apparatus of FIG. 6 is assumed to be 2 MHz, and therefore the center frequency of the band-pass filter circuit of FIG. 11 is set at 2 MHz. By setting the center frequency in a range of from 1 to 3 MHz in this way, it is possible to reduce the order of the band-pass filter circuit of FIG. 11 and thereby reduce its costs.

Next, the configuration of the band-pass filter circuit shown in FIG. 11 will be described. It is to be noted that such circuit elements as are found also in FIG. 17 are identified with the same reference numerals and symbols, and their explanations will be omitted. The band-pass filter circuit of FIG. 11 is formed by providing the conventional gm band-pass filter 101 shown in FIG. 17 additionally with a low-pass filter 104.

The low-pass filter 104 is composed of a resistor R101 and a capacitor C101. One end of the resistor R101 is connected to an input terminal 102, and the other end of the resistor R101 is connected to one end of the capacitor C101 and to one end of the equivalent inductor circuit L3. The other end of the capacitor C101 is grounded.

In this embodiment, the circuit constants of the low-pass filter 104 are so set that the cutoff frequency of the low-pass filter 104 is 3.18 MHz. Moreover, in this embodiment, the circuit constants of the gm band-pass filter portion 101, i.e., the conductances of the operational transconductance amplifiers and the capacitances of the capacitors, are so set that the lower cutoff frequency is 1.6 MHz, the higher cutoff frequency is 2.4 MHz, and the center frequency is 2 MHz. By setting the cutoff frequency of the low-pass filter 104 higher than the center frequency of the gm band-pass filter portion 101 in this way, it is possible to prevent attenuation of the target signal, i.e., a signal having a frequency of 2 MHz (a signal having a frequency equal to the center frequency of the band-pass filter circuit of FIG. 11).

Figure 12:
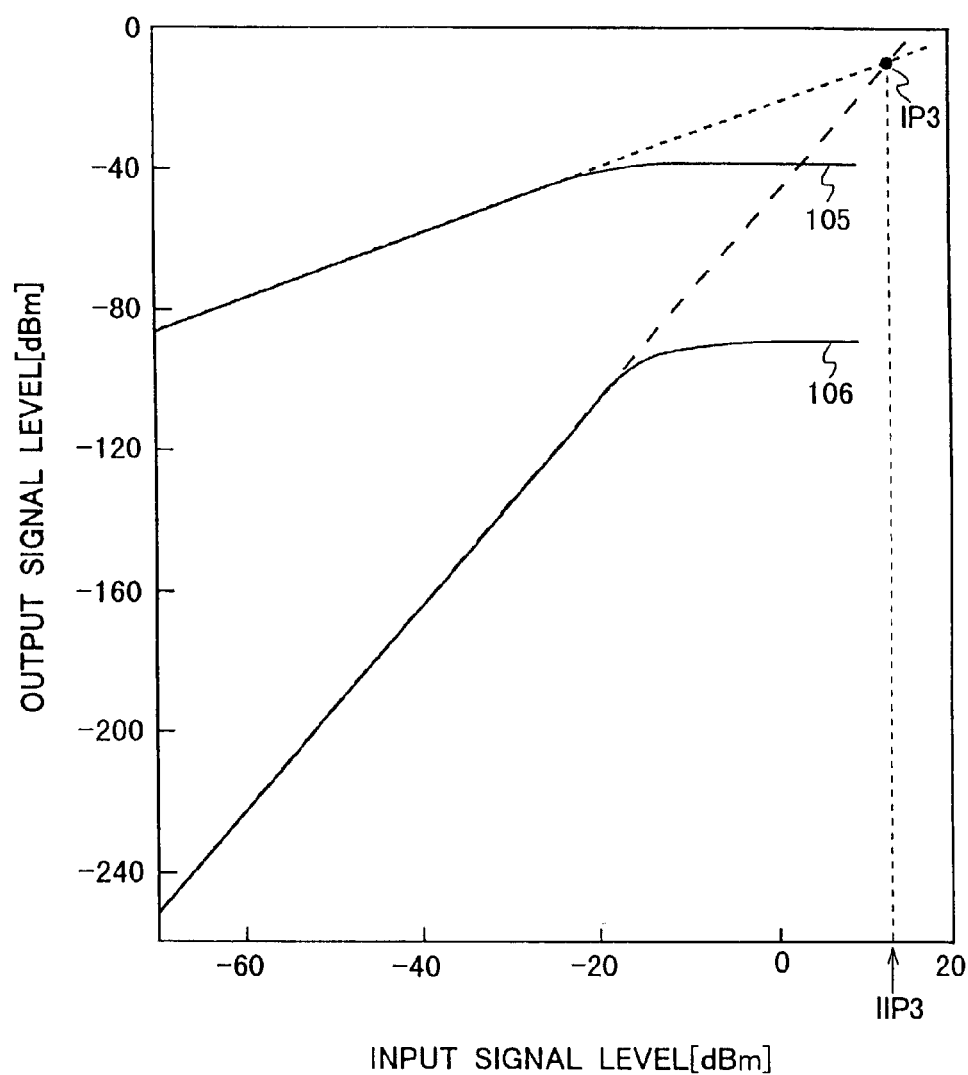
FIG. 12 is a diagram showing the distortion characteristics of the band-pass filter circuit of FIG. 11.

Next, the third-order input intercept point of the band-pass filter circuit of FIG. 11 will be described with reference to FIG. 12, which shows the distortion characteristics of the band-pass filter circuit of FIG. 11.

Figure 19:
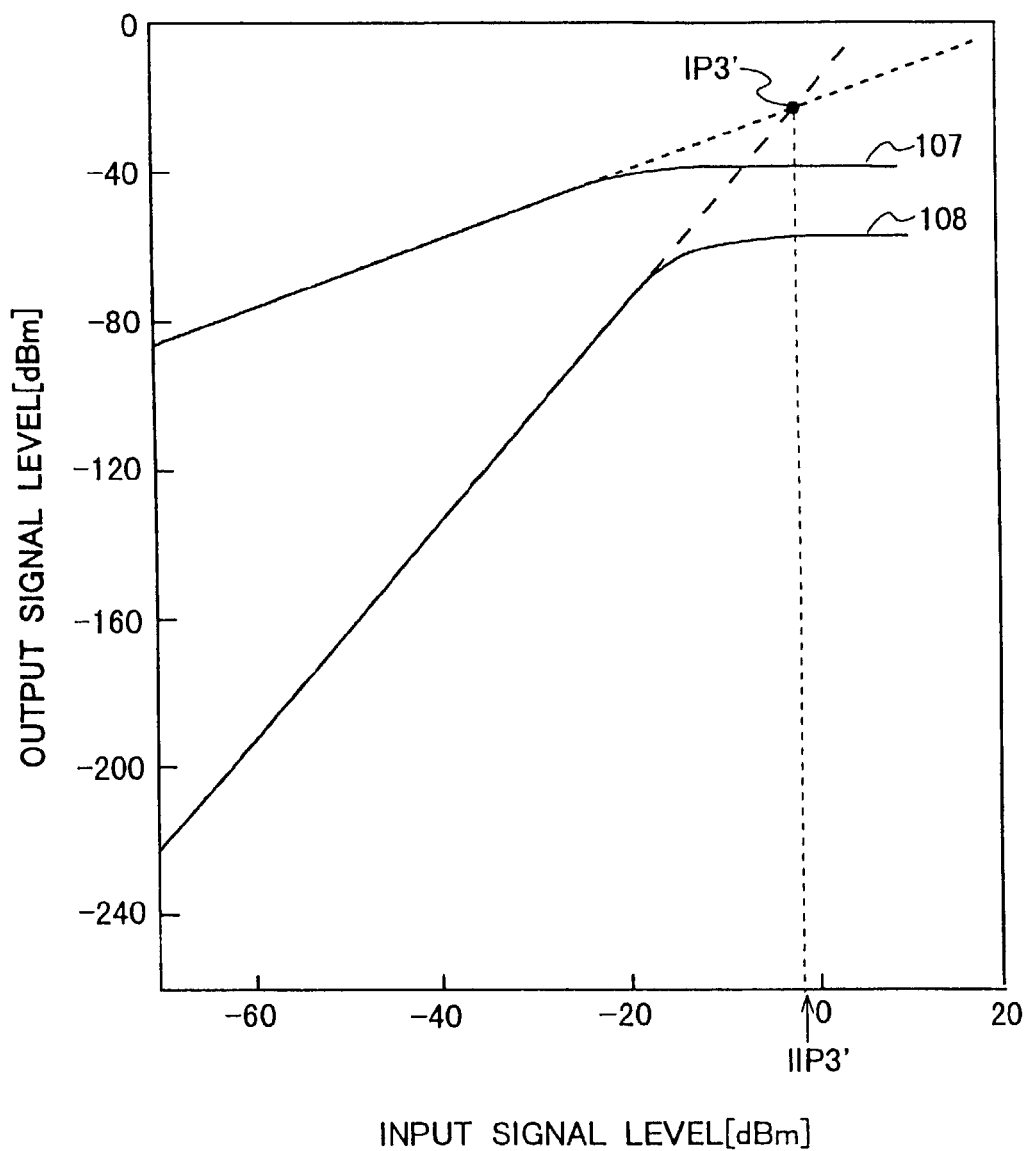
FIG. 19 is a diagram showing the distortion characteristics of the band-pass filter circuit of FIG. 17.

The output 106 of the third-order intermodulation distortion is determined by feeding two signals, having frequencies of 5 MHz and 8 MHz respectively and having identical levels, to the input terminal 102 and measuring the levels of the third-order intermodulation distortion appearing in the output signal, i.e., the levels of a 2 (2×5−8) MHz signal and a 11 (2×8−5) MHz (this method is called two-tone measurement). In the band-pass filter circuit of FIG. 11, the low-pass filter 104 attenuates the 5 MHz and 8 MHz signals, and this reduces the level of the third-order intermodulation distortion produced by the intermodulation of those two signals. As a result, the output 106 of the third-order intermodulation distortion in the band-pass filter circuit of FIG. 11 is lower than the output 108 (see FIG. 19) of the third-order intermodulation distortion in the conventional gm band-pass filter shown in FIG. 17.

Moreover, since, as described above, the cutoff frequency of the low-pass filter 104 is set higher than the center frequency of the gm band-pass filter portion 101 so that the low-pass filter 104 does not attenuate the target signal, i.e., a 2 MHz signal, the linear portion of the target signal output 105 in the band-pass filter circuit of FIG. 11 is identical with the linear portion of the target signal output 107 (see FIG. 19) in the conventional gm band-pass filter shown in FIG. 17.

As a result, the third input intercept point IIP3 of the band-pass filter circuit of FIG. 11 is higher than the third input intercept point IIP3' of the conventional gm band-pass filter shown in FIG. 17. Specifically, the third input intercept point IIP3 of the band-pass filter circuit of FIG. 11 is 13 dBm, while the third input intercept point IIP3' of the conventional gm band-pass filter shown in FIG. 17 is −2 dBm.

Moreover, unnecessary waves having higher frequencies than the cutoff frequency of the low-pass filter 104 are eliminated by the low-pass filter 104. This helps reduce the third-order intermodulation distortion produced by unnecessary waves having higher frequencies than the cutoff frequency of the low-pass filter 104.

Figure 18:
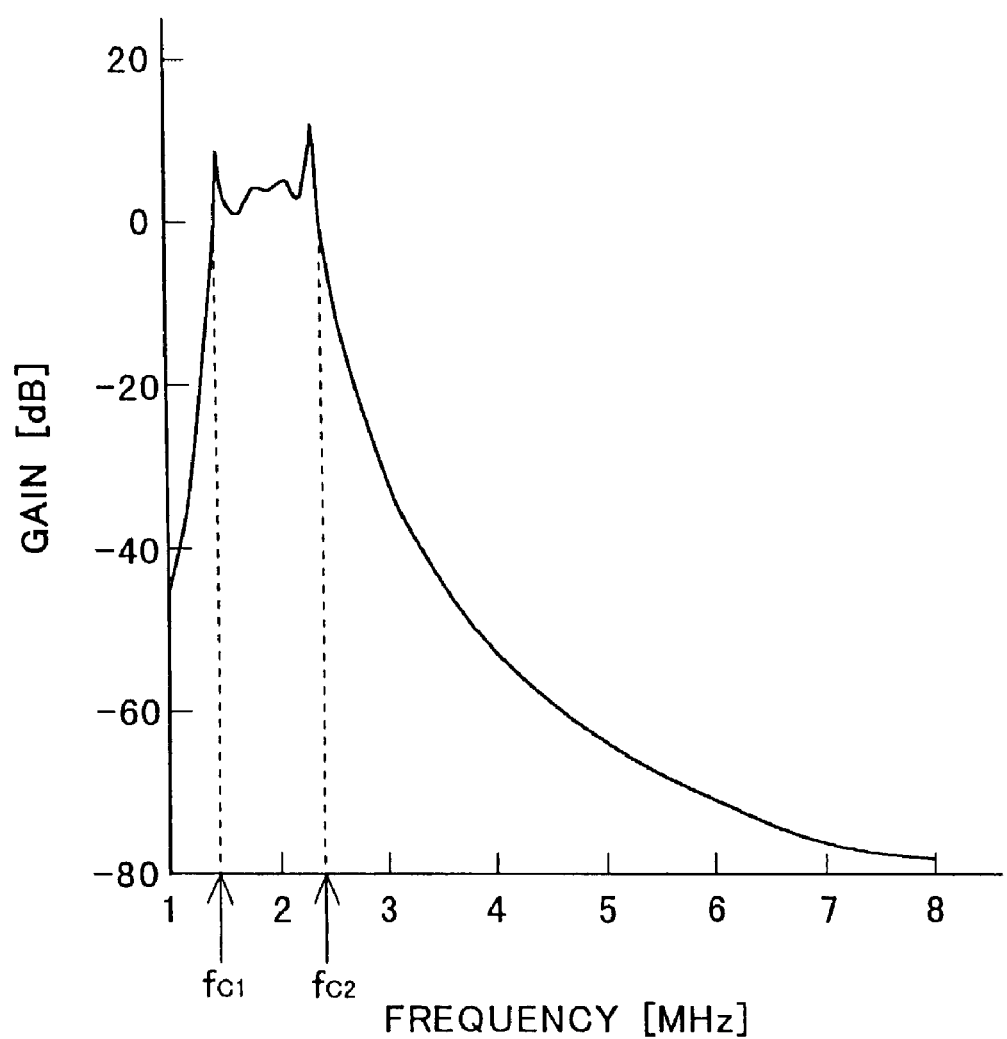
FIG. 18 is a graph showing the gain characteristics of the band-pass filter circuit of FIG. 17.

Moreover, the value obtained by dividing the higher cutoff frequency of the gm band-pass filter portion 101 by its lower cutoff frequency is smaller than 2 (see FIG. 18). This helps widen the frequency range of unnecessary waves that can be eliminated by the gm band-pass filter portion 101.

Thanks to the above-described effects achieved by the band-pass filter circuit of FIG. 11, employing the band-pass filter circuit of FIG. 11 as the band-pass filter circuit 28 provided in the receiver apparatus of FIG. 6 makes it possible to obtain satisfactory reception performance in the receiver apparatus of FIG. 6.

What is claimed is:

1. An equivalent inductor circuits, comprising:
   a capacitor;
   a gyrator composed of a plurality of operational transconductance amplifiers and having said capacitor as a load, the operational transconductance amplifiers each includes
   a first differential pair composed of a first MOS transistor and a second MOS transistor,
   a second differential pair composed of a third MOS transistor and a fourth MOS transistor,
   a first current source for driving said first differential pair,
   a second current source for driving said second differential pair, wherein said first and second current sources produce identical currents,
   a gate of said first MOS transistor and a gate of said third MOS transistor are connected together, a gate of said second MOS transistor and a gate of said fourth MOS transistor are connected together, a drain of said first MOS transistor and the drain of said third MOS transistor are connected together, a drain of said second MOS transistor and a drain of said fourth MOS transistor are connected together, and
   a ratio of a value obtained by dividing a gate width of said first MOS transistor by a gate length thereof to a value obtained by dividing a gate width of said second MOS transistor by a gate length thereof is 1:k (where k is a constant), and a ratio of a value obtained by dividing a gate width of said third MOS transistor by a gate length thereof to a value obtained by dividing a gate width of said fourth MOS transistor by a gate length thereof is k: 1 (where k is a constant); and
   a resistor connected in series with said capacitor.

2. The equivalent inductor circuit as claimed in claim 1, wherein said resistor has a resistance such that an imaginary part of an impedance of the equivalent inductor circuit is positive irrespective of a frequency of an input signal used.

3. The equivalent inductor circuit as claimed in claim 1, wherein said resistor has a resistance in a range of from a few hundred Ω to a few kΩ.

4. The equivalent inductor circuit as claimed in claim 1, wherein k equals approximately 10.

5. An adjustment-free filter circuit, comprising:
a first filter circuit including an equivalent inductor circuit comprising a first capacitor, a gyrator composed of a plurality of operational transconductance amplifiers and having said first capacitor as a load, and a resistor connected in series with said first capacitor, said first filter circuit receiving a signal having a predetermined frequency;
a phase comparator circuit for producing a signal commensurate with a phase difference between said signal having the predetermined frequency and an output signal of said first filter circuit;
a second filter circuit including an equivalent inductor circuit comprising a second capacitor, a gyrator composed of a plurality of operational transconductance amplifiers and having said second capacitor as a load, and a resistor connected in series with said second capacitor; and
a control circuit for varying, according to an output signal of said phase comparator circuit, currents produced by current sources provided in the operational transconductance amplifiers provided in said first and second filter circuits.

6. The adjustment-free filter circuit as claimed in claim 5, wherein the plurality of operational transconductance amplifiers provided in said first and second filter circuits all have identical conductances.

7. The adjustment-free filter circuit as claimed in claim 5, wherein the capacitors are all formed as a circuit having a plurality of unit capacitors connected in series and/or in parallel.

8. A receiver system including an adjustment-free filter circuit, wherein the adjustment-free filter circuit, comprises:
a first filter circuit including an equivalent inductor circuit comprising a first capacitor, a gyrator composed of a plurality of operational transconductance amplifiers and having said first capacitor as a load, and a resistor connected in series with said first capacitor, said first filter circuit receiving a signal having a predetermined frequency;
a phase comparator circuit for producing a signal commensurate with a phase difference between said signal having the predetermined frequency and an output signal of said first filter circuit;
a second filter circuit including an equivalent inductor circuit comprising a second capacitor, a gyrator composed of a plurality of operational transconductance amplifiers and having said second capacitor as a load, and a resistor connected in series with said second capacitor; and
a control circuit for varying, according to an output signal of said phase comparator circuit, currents produced by current sources provided in the operational transconductance amplifiers provided in said first and second filter circuits.

9. The receiver system as claimed in claim 8, wherein the plurality of operational transconductance amplifiers provided in the gyrator provided in said first filter circuit and the plurality of operational transconductance amplifiers provided in the gyrator provided in said second filter circuit all have identical conductances.

10. The receiver system as claimed in claim 8, wherein the capacitors provided in said first and second filter circuits are all formed as a circuit having a plurality of unit capacitors connected in series and/or in parallel.

* * * * *